(12) United States Patent
Sasaki et al.

(10) Patent No.: US 7,160,770 B2
(45) Date of Patent: Jan. 9, 2007

(54) METHOD OF MANUFACTURING AN ELECTRONIC COMPONENT INCLUDING AN INTER-LINE INSULATING LAYER AND A CONDUCTOR PATTERN

(75) Inventors: Toshiya Sasaki, Takefu (JP);
Kazuyoshi Uchiyama, Takefu (JP);
Masahiko Kawaguchi, Takefu (JP);
Keishiro Amaya, Fukui (JP); Eita Tamezawa, Fukui-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 5 days.

(21) Appl. No.: 10/269,588

(22) Filed: Oct. 12, 2002

(65) Prior Publication Data

US 2003/0038372 A1 Feb. 27, 2003

Related U.S. Application Data

(62) Division of application No. 09/350,038, filed on Jul. 8, 1999, now Pat. No. 6,555,913.

(30) Foreign Application Priority Data

Jul. 17, 1998 (JP) ................................. 10-203124
Jul. 23, 1998 (JP) ................................. 10-208157

(51) Int. Cl.
*H01L 21/8234* (2006.01)
*H01L 21/8244* (2006.01)
(52) U.S. Cl. .................... 438/238; 438/667; 438/669
(58) Field of Classification Search .......... 438/667, 438/669–671, 677, 238; 336/200, 232; 361/268, 361/821

See application file for complete search history.

(56) References Cited

U.S. PATENT DOCUMENTS

| 3,443,944 | A | * | 5/1969 | Wise .................... 430/198 |
| 4,416,056 | A | * | 11/1983 | Takahashi ............... 29/603.24 |
| 5,173,392 | A | * | 12/1992 | Miersch et al. ........... 430/311 |
| 5,446,311 | A | | 8/1995 | Ewen et al. |
| 5,481,131 | A | * | 1/1996 | Staudinger et al. ........ 257/531 |
| 5,846,849 | A | * | 12/1998 | Shaw et al. ................ 438/52 |
| 5,874,770 | A | * | 2/1999 | Saia et al. ............... 257/536 |
| 5,936,298 | A | * | 8/1999 | Capocelli et al. .......... 257/531 |

FOREIGN PATENT DOCUMENTS

| JP | 05-335487 A | 12/1993 |
| JP | 08-316080 A | 11/1996 |
| JP | 09-045570 A | 2/1997 |

* cited by examiner

*Primary Examiner*—Hoai Pham
(74) *Attorney, Agent, or Firm*—Keating & Bennett, LLP

(57) ABSTRACT

A small size electronic component has a small direct current resistance value of a conductor pattern and minimal dimensional irregularity of a conductor pattern. In order to form such a component, a photosensitive conductive paste applied on a ceramic substrate and is then exposed through a photo mask and developed so as to form a lower conductor pattern layer of a coil conductor pattern. Then an insulating paste is applied on the ceramic substrate so as to cover the lower conductor pattern layer and the insulating paste is removed with a solvent until at least the upper surface of the lower conductor pattern layer is exposed so as to form an inter-line insulating layer. Furthermore, after applying a photosensitive conductive paste as a film, the exposure and development operation is conducted again while using the photo mask so as to form an upper conductor pattern layer on the lower conductor pattern layer.

12 Claims, 8 Drawing Sheets

METHOD OF MANUFACTURING AN ELECTRONIC COMPONENT INCLUDING AN INTER-LINE INSULATING LAYER AND A CONDUCTOR PATTERN

This application is a Divisional of U.S. patent application Ser. No. 09/350,038 filed Jul. 8, 1999, now U.S. Pat No. 6,555,913.

BACKGROUND OF THE INVENTION

1. Field of the Invention

The present invention relates to an electronic component and a production method thereof. More specifically, the present invention relates to an electronic component such as a surface mount type inductor or strip line component, or other similar component, which is to be mounted on the surface of a pattern of a printed circuit board, and a production method thereof.

2. Description of the Related Art

A method of manufacturing a surface mount type inductor having a high Q value includes forming a coil conductive pattern on a ceramic mother substrate by a screen printing process with a large coil conductive pattern film thickness (large cross-sectional area) for having a small coil conductive pattern direct current resistance value (conductor loss) is commonly known. However, according to this screen printing method, the size of the coil conductive pattern is extremely irregular in terms of the accuracy. In addition, the deviation of the inductance values is large and it is difficult to have a narrow conductor width for the coil conductor.

On the other hand, as a method of manufacturing an inductor with a small inductance value deviation, a method of forming a metal film on a mother substrate via sputtering, deposition, or the like, and forming a coil conductor pattern using photolithography technology is commonly known. However, according to this method, it is difficult to have a thick coil conductor pattern thickness compared with the screen printing method, and thus, it is difficult to produce an inductor with a high Q value.

Then, as a method of producing an inductor with a high Q value and a small inductance value deviation, a method of forming a coil conductor pattern including a combination of thick film printing and photolithography technology, using a photosensitive conductive paste, and a method of forming a coil conductor pattern with a thick film and a high size accuracy via a method referred to as a semi-additive process have been proposed (see, for example, the Official Gazettes of Japanese Unexamined Patent Publication Nos. 8-316080 and 945570).

However, due to a high production cost caused by a large number of manufacturing and processing steps required by the semi-additive process, a method of using a photosensitive conductive paste is preferable. However, in order to obtain a small size inductor having a large inductance value, a very small size coil conductor pattern must be formed within a limited coil conductor forming area. Therefore, even in the case of using a photosensitive conductive paste in the conventional method, a problem occurs in that the line width of the coil conductor pattern becomes small so as to have a large conductor loss, and thus, the Q value is lowered. Moreover, since the limit of the resolution of a photosensitive conductive paste in the thickness direction has an aspect ratio of 1 (after development), it is difficult to have a thicker photosensitive conductive paste film. The aspect ratio of a coil conductor pattern is defined as the ratio of the thickness to the pattern width of a coil conductor pattern.

SUMMARY OF THE INVENTION

To overcome the problems described above, preferred embodiments of the present invention provide a very small size electronic component having a small direct current resistance value in a conductor pattern and an extremely accurate conductor pattern size, and a production method thereof.

According to one preferred embodiment of the present invention which achieves the advantageous results described in the preceding paragraph, an electronic component includes a conductor pattern having a lower conductor pattern layer disposed on an insulating substrate and an upper conductor pattern layer laminated on the lower conductor pattern layer, wherein a ratio of the conductor pattern thickness and the pattern width is equal to or greater than about 1.

Since the conductor pattern includes the lower conductor pattern layer and the upper conductor pattern layer, the cross-sectional area thereof is preferably substantially equal to the sum of the cross-sectional area of the lower conductor pattern layer and the cross-sectional area of the upper conductor pattern layer. Accordingly, the cross-sectional area of the conductor pattern can be large, and thus, the direct current resistance value of the conductor pattern can be reduced. Furthermore, by having a coil conductor pattern preferably having a spiral shape as the conductor pattern, an inductor having a high Q value and a large inductance value is achieved. Moreover, since the aspect ratio defined as the ratio of the conductor pattern thickness to the pattern width is equal to or greater than about 1, the pattern width size of the conductor pattern can be minimized, and thus, the area on the insulating substrate occupied by the conductor pattern is greatly reduced without increasing the direct current resistance value of the conductor pattern.

Moreover, another preferred embodiment of the present invention provides a method of manufacturing an electronic component including a conductor pattern having a lower conductor pattern layer disposed on an insulating substrate and an upper conductor pattern layer laminated on the lower conductor pattern layer, the method including the steps of forming the lower conductor pattern layer on the insulting substrate, applying an insulating material on the insulating substrate as a film so as to cover the lower conductor pattern layer and eliminating the insulating material until at least the upper surface of the lower conductor pattern layer is exposed so as to form an inter-line insulating layer, and forming the upper conductor pattern layer on the lower conductor pattern layer.

Furthermore, according to another preferred embodiment of the present invention, a method of manufacturing an electronic component including a conductor pattern having a lower conductor pattern layer disposed on an insulating substrate and an upper conductor pattern layer laminated on the lower conductor pattern layer, the method including the steps of applying a photosensitive conductive material on the insulating substrate as a film and exposing and developing the photosensitive conductive material through a photo mask for forming the lower conductor pattern layer, applying an insulating material on the insulating substrate as a film so as to cover the lower conductor pattern layer and eliminating the insulating material until at least the upper surface of the lower conductor pattern layer is exposed so as to form an inter-line insulating layer, and applying a photosensitive conductive material on the inter-line insulating layer and the lower conductor pattern layer as a film and exposing and developing the photosensitive conductive material through a photo mask for forming the upper conductor pattern layer on the lower conductor pattern layer.

According to the above-mentioned methods, a lower conductor pattern layer and an upper conductor pattern layer of a conductor pattern can be formed easily. Moreover, the resulting conductor pattern has a high aspect ratio which is higher than the resolution limit of the conductive material in the depth direction.

Furthermore, by repeating the steps of forming an inter-layer insulating layer having via holes on the inter-line insulating layer and the conductor pattern, forming a lower conductor pattern layer, forming an inter-line insulating layer and forming an upper conductor pattern layer subsequently, an electronic component having a multi-layer structure in which a plurality of the conductor patterns are provided with an inter-layer insulating layer provided therebetween is provided.

To achieve the advantages described in the preceding paragraph, a method of manufacturing an electronic component according to the present invention includes the steps of applying an insulating material on an insulating substrate as a film and eliminating a specific component of the insulating material so as to form an inter-line insulating layer having a pattern groove and filling the pattern groove with a conductive material, applying the conductive material on the inter-line insulating layer as a film and eliminating a specific component of the conductive material so as to form a conductor pattern projecting from the surface of the inter-line insulating layer at the position of the pattern groove.

Furthermore, a method of manufacturing an electronic component according to a further preferred embodiment of the present invention includes the steps of applying a positive type photosensitive insulating material on an insulating substrate as a film, exposing the positive type photosensitive insulating material through a photo mask having a light transmitting component corresponding with a conductor pattern, and eliminating the exposed component of the positive type photosensitive insulating material so as to form an inter-line insulating layer having a pattern groove and applying a negative type photosensitive conductive material on the inter-line insulating layer as a film, exposing the negative type photosensitive conductive material through the photo mask, and eliminating the unexposed component of the negative type photosensitive conductive material so as to form a coil conductor pattern at the position of the pattern groove.

Moreover, another preferred embodiment provides a method of manufacturing an electronic component including the steps of applying a negative type photosensitive insulating material on an insulating substrate as a film, exposing the negative type photosensitive insulating material through a photo mask having a light blocking component corresponding with a conductor pattern, and eliminating the unexposed component of the negative type photosensitive insulating material so as to form an interline insulating layer having a pattern groove and applying a positive type photosensitive conductive material on the inter-line insulating layer as a film, exposing the positive type photosensitive conductive material through the photo mask, and eliminating the exposed component of the positive type photosensitive conductive material so as to form a conductor pattern at the position of the pattern groove.

By applying a conductive material on an inter-line insulating layer as a film according to the above-mentioned methods, a pattern groove is filled with the conductive material. Therefore, the sum of the depth of the pattern groove formed in the inter-line insulating layer and the thickness of the conductive material film on the inter-line insulating layer is the thickness of the conductor pattern. Accordingly, even if the ratio of the inter-line insulating layer film thickness and the pattern groove width is set to be less than about 1, a conductor pattern having a ratio of the conductor pattern thickness to the pattern width of about 1 or more and a high aspect ratio which is more than the resolution limit of the photosensitive conductive material in the depth direction can be formed. As a result, the direct current resistance value of the conductor pattern is much smaller than a conventional one. Furthermore, by having a coil conductor pattern with a spiral shape as the conductor pattern, an inductor having a high Q value and a large inductance value is achieved.

Moreover, by repeating the steps of forming an inter-layer insulating layer having via holes on the inter-line insulating layer and the conductor pattern, forming an interline insulating layer and forming a conductor pattern subsequently, an electronic component having a multi-layer structure in which a plurality of the conductor patterns are provided with an inter-layer insulating layer provided therebetween, is obtained.

Other features and advantages of the present invention will become apparent from the following description of preferred embodiments of the present invention which refers to the accompanying drawings.

DETAILED DESCRIPTION OF PREFERRED EMBODIMENTS

Hereinafter preferred embodiments of an electronic component according to the present invention and a method of manufacturing thereof will be explained with reference to the accompanying drawings. Although examples of an inductor will be explained as the electronic component, the present invention is not limited to the inductor but can be a strip line component, or other electronic component.

Figure 1:
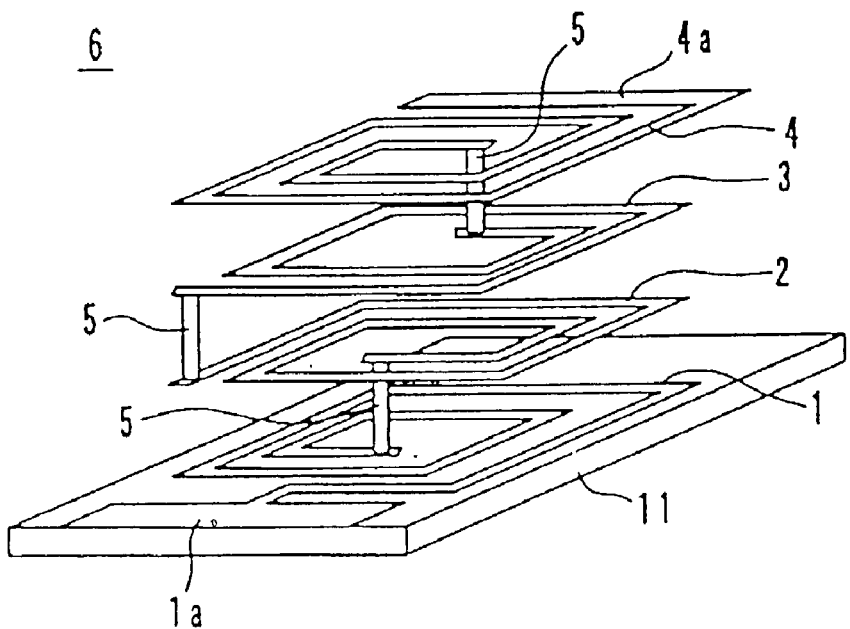
FIG. 1 is a perspective view showing the configuration of a preferred embodiment of an electronic component according to the present invention.

As shown in FIG. 1, an inductor 6 includes an insulating substrate 11 and spiral coil conductor patterns 1 to 4 provided on the insulating substrate 11. The insulating substrate 11 is made of a dielectric substance, an insulating material, or other suitable material. The coil conductor patterns 1 to 4 are connected electrically in series by via holes 5.

A method of manufacturing the multi-layer spiral inductor 6 will be explained with reference to FIGS. 2 to 12. Although the inductor 6 is manufactured using a mother substrate provided with a plurality of inductors for mass-production, the case of individual production will be explained in the first preferred embodiment.

Figure 2:
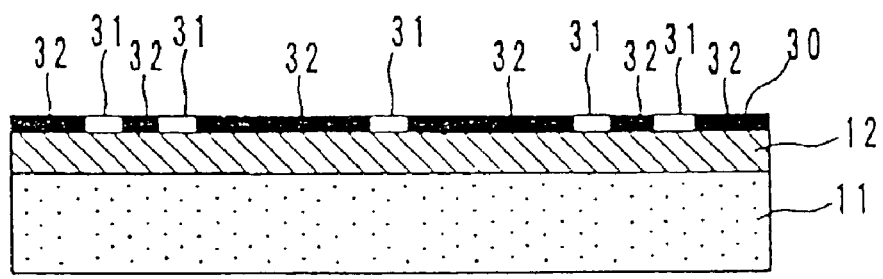
FIG. 2 is a cross-sectional view showing a preferred embodiment of a method of manufacturing an electronic component according to the present invention.
Figure 3:
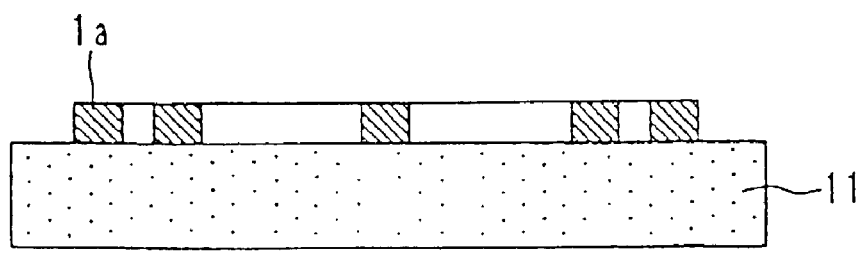
FIG. 3 is a cross-sectional view showing a manufacturing step preformed subsequent to the step shown in FIG. 2.

As shown in FIG. 2, a photosensitive conductive material 12 is applied on a ceramic substrate 11 as a film by printing a photosensitive Ag paste, a photosensitive Cu paste, or other suitable material. Then, a negative film photo mask 30 is put on the photosensitive conductive material 12. The photo mask 30 has a light transmitting component 31 corresponding to a coil conductor pattern 1 of the first layer in FIG. 1 and a light blocking component 32. When the photosensitive conductive material 12 is exposed through the photo mask 30, only the light transmitting component 31 transmits the light. By removing the photo mask 30 and developing the photosensitive conductive material 12, the unexposed component of the photosensitive conductive material 12 is eliminated so as to form a lower conductor pattern layer 1a of the first layer spiral coil conductor pattern 1 as shown in FIG. 3.

Figure 4:
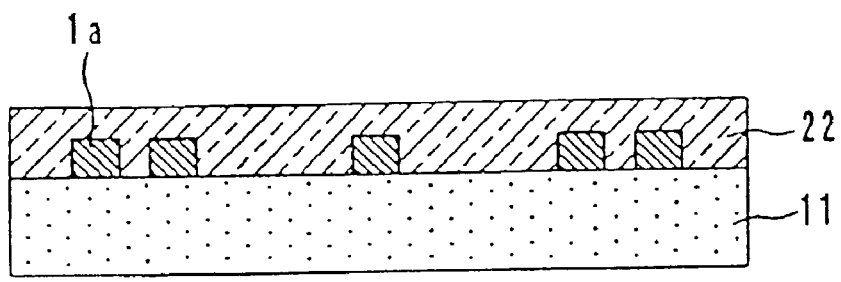
FIG. 4 is a cross-sectional view showing a manufacturing step preformed subsequent to step shown in FIG. 3.
Figure 5:
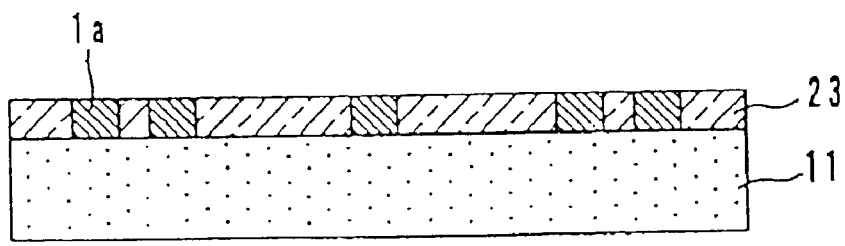
FIG. 5 is a cross-sectional view showing a manufacturing step performed subsequent to the step shown in FIG. 4.

As shown in FIG. 4, an insulating material 22 is applied on the ceramic substrate 11 so as to cover the lower conductor pattern layer 1a via a method such as printing, or other suitable method. The insulating material 22 can either be an organic material or an inorganic material. For example, a resin paste such as polyimide or a glass paste can be used. As shown in FIG. 5, the insulating material 22 is washed out by, for example, a solvent until the thickness of the insulating material 22 becomes substantially equal to the thickness of the lower conductor pattern layer 1a so as to expose the lower conductor pattern 1a in order to form an inter-line insulating layer 23. At the time, the solvent does not dissolve the lower conductor pattern layer 1a. Abrasion or other suitable method can also be used for dissolving the lower conductor pattern.

Figure 6:
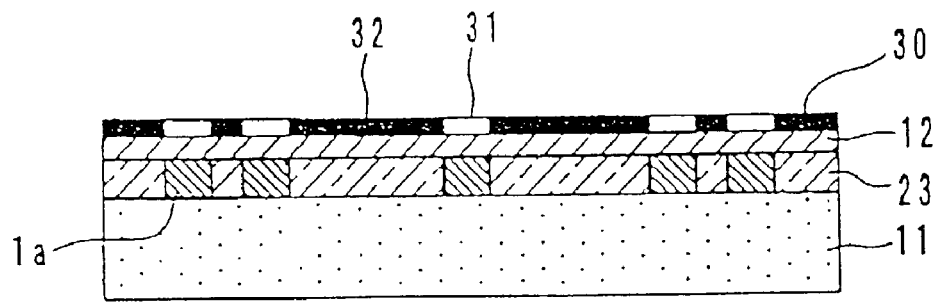
FIG. 6 is a cross-sectional view showing a manufacturing step performed subsequent to the step shown in FIG. 5.
Figure 7:
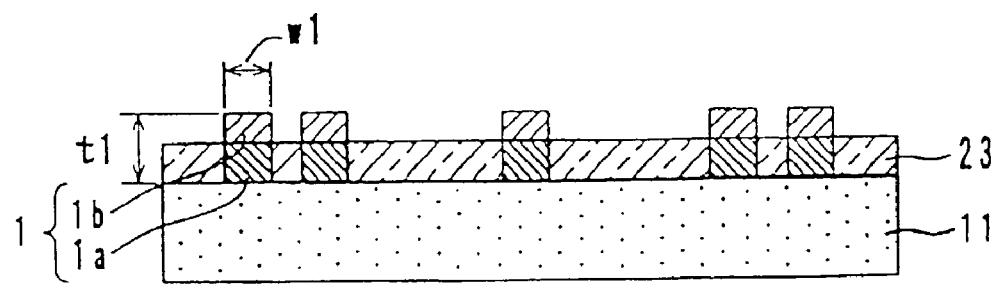
FIG. 7 is a cross-sectional view showing a manufacturing step performed subsequent to the step shown in FIG. 6.

As shown in FIG. 6, a photosensitive conductive material 12 is applied on the inter-line insulating layer 23 as a film by printing a photosensitive Ag paste, a photosensitive Cu paste, or other suitable material. Then, the above-mentioned photo mask 30 is put on the photosensitive conductive material 12. After exposing the photosensitive conductive material 12 through the photo mask 30, the photosensitive conductive material is developed so as to eliminate the undeveloped component of the photosensitive conductive material 12 as shown in FIG. 7. Accordingly, an upper conductor pattern layer 1b can be formed on the lower conductor pattern layer 1a. As mentioned above, a first layer spiral coil conductor pattern 1 (see FIG. 1) is formed on the ceramic substrate 11. The thickness of the lower conductor pattern layer 1a and the thickness of the upper conductor pattern layer 1b are preferably selected such that the aspect ratio (t1/w1) of the coil conductor pattern 1 defined by the thickness t1 and the width w1 thereof can be about 1 or more. Then, a heat treatment is conducted at about 800 to 900° C. If the material of the inter-line insulating layer 23 contains a glass material, the inter-line insulating layer 23 remains in a slightly shrunk state. If the material contains a resin such as polyimide, or other similar material, the inter-line insulating layer 23 is scattered. In the first preferred embodiment, a material containing a glass was used as the material of the inter-line insulating layer 23.

Figure 8:
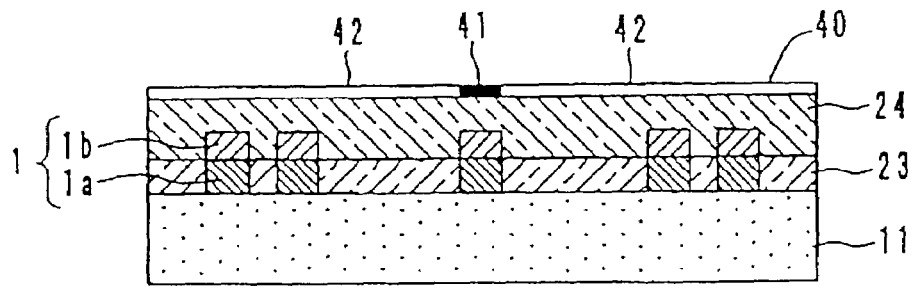
FIG. 8 is a cross-sectional view showing a manufacturing step performed subsequent to the step shown in FIG. 7.
Figure 9:
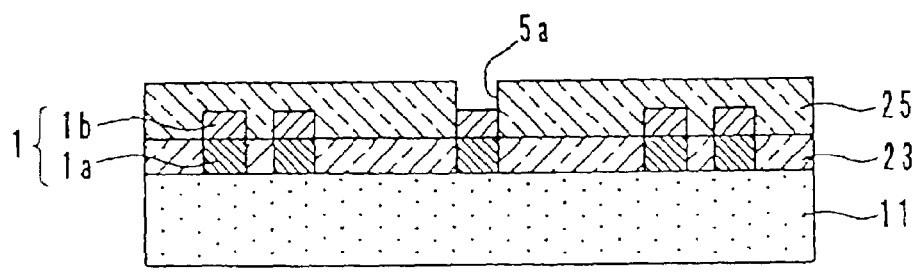
FIG. 9 is a cross-sectional view showing a manufacturing step performed subsequent to the step shown in FIG. 8.

As shown in FIG. 8, a photosensitive insulating material 24 is applied on the first layer coil conductor pattern 1 and the inter-line insulating layer 23 as a film by printing a photosensitive glass paste, or other suitable material. Then, a photo mask 40 is put on the photosensitive insulating material 24. The photo mask 40 has a light blocking component 41 corresponding to a via hole for being electrically connected to the first layer coil conductor pattern 1 shown in FIG. 1 and a light transmitting component 42. By exposing the photosensitive insulating material 24 through the photo mask 40 and developing the same for eliminating the unexposed component of the photosensitive insulating material 24, an inter-layer insulating layer 25 having a hole 5a for the via hole 5 can be formed as shown in FIG. 9. Then, a heat treatment is conducted again.

Figure 10:
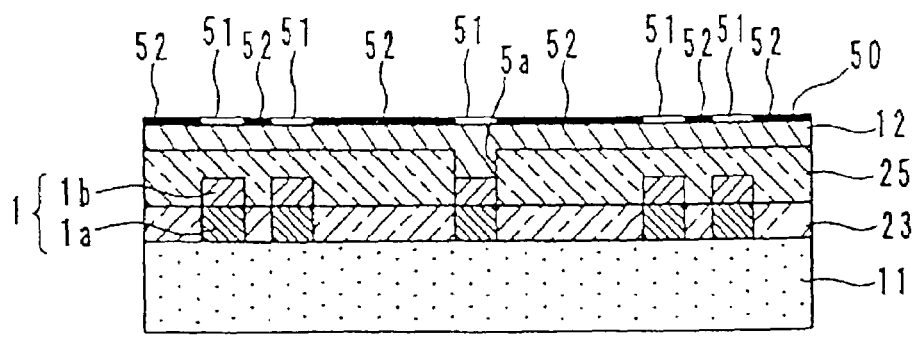
FIG. 10 is a cross-sectional view showing a manufacturing step performed subsequent to the step shown in FIG. 9.
Figure 11:
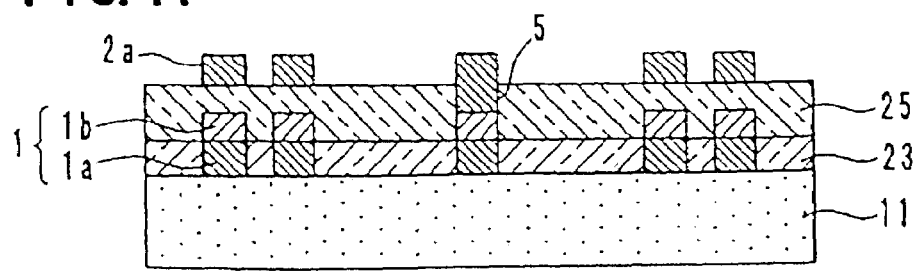
FIG. 11 is a cross-sectional view showing a manufacturing step performed subsequent to the step shown in FIG. 10.

As shown in FIG. 10, the photosensitive conductive material 12 is applied on the inter-layer insulating layer 25 as a film via a method such as printing. The hole for via hole 5a is also filled with the photosensitive conductive material 12. Then, a photo mask 50 is put on the photosensitive conductive material 12. The photo mask 50 has a light transmitting component 51 corresponding with a coil conductor pattern 2 in the second layer of FIG. 1 and a light blocking component 52. After exposing the photosensitive conductive material 12 through the photo mask 50, the photosensitive conductive material is developed so as to eliminate the unexposed component of the photo sensitive conductive material 12. Accordingly, a lower conductor pattern layer 2a of a second layer coil conductor pattern 2 (see FIG. 1) is formed on the inter-layer insulating layer 25. The lower conductor pattern layer 2a is electrically connected with the coil conductor pattern 1 through a via hole 5.

Figure 12:
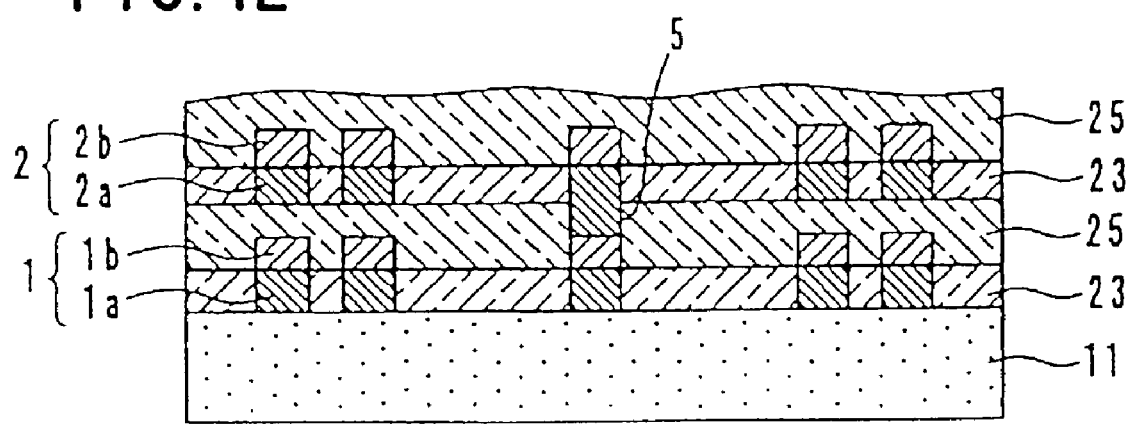
FIG. 12 is a cross-sectional view showing a manufacturing step performed subsequent to the step shown in FIG. 11.

After repeating the steps of forming lower conductor pattern layers 3a, 4a of coil conductor patterns 3, 4, forming an inter-line insulating layer 23, forming upper conductor pattern layers 2b to 4b of coil conductor patterns 2 to 4, and forming an inter-layer insulating layer 25 at predetermined times in the same manner so as to form a multi-layer structure shown in FIG. 12, an exterior protection film is formed. If the above-described layers are formed on a mother substrate state, furthermore, the mother substrate needs to be cut out according to a predetermined product size via a suitable cutting method such as scribing, breaking or dicing. Terminal electrodes to be connected to the connecting component 1a of the first layer coil conductor pattern 1 and the connecting component 4a of the fourth layer coil conductor pattern 4 of FIG. 1 are formed on both end components of the ceramic substrate 11. Accordingly, a multi-layer spiral inductor 6 having a configuration where the spiral conductor patterns 1 to 4 are connected electrically by the plurality of via holes 5 between a pair of the terminal electrodes can be obtained.

As mentioned above, by producing the multi-layer spiral inductor 6, the coil conductor patterns 1 to 4 having a configuration where the upper conductor pattern layers 1b to 4b are formed on the lower conductor pattern layers 1a to 4a can be obtained easily. Accordingly, each of the coil conductor patterns 1 to 4 can have a film thickness which is greater than the resolution limit of the photosensitive conductive material in the depth direction. As mentioned above, a multi-layer spiral inductor having the coil conductor patterns 1 to 4 having a high aspect ratio which is equal to or greater than about 1 and almost no irregularity in the inductance value can be obtained easily.

As shown in FIG. 12, in the multi-layer spiral inductor 6 having the above-mentioned configuration, each of the coil conductor patterns 1 to 4 (in FIG. 12, only the coil conductor patterns 1 and 2 are shown) includes the lower conductor pattern layer 1a to 4a and the upper conductor pattern layer 1b to 4b, with the aspect ratio defined as the ratio of the thickness t1 and the width w1 thereof (t1/w1) having a value that is equal to or greater than about 1. Therefore, the direct current resistance value of the coil conductor patterns 1 to 4 can be small so as to prevent the decline of the Q value. Moreover, even if the width of the coil conductor patterns 1 to 4 is made narrower for minimizing the size of the multi-layer spiral conductor 6, the increase of the conductor loss of the coil conductor patterns 1 to 4 is minimized and deterioration of the Q value accompanying the reduction in size is also minimized.

In the preferred second embodiment, the case of producing an inductor with a non-photosensitive conductive material used as the material of the coil conductor patterns 1 to 4, and a non-photosensitive insulating material used as the material of the inter-line insulating layer 23 and the inter-line insulating layer will be explained.

A non-photosensitive conductive material is formed on the entire upper surface of the ceramic substrate 11 as a film via a method such as printing, sputtering, deposition, or other suitable method. By a known photolithography technology (resist film application, exposure, resist film development, conductive material etching, resist film peeling), or the like, the lower conductor pattern layer 1a of the coil conductor pattern 1 is formed. The lower conductor pattern layer 1a can be formed via a method of putting a mask material having a hole provided in a predetermined component on the upper surface of the ceramic substrate 11 and applying a non-photosensitive conductive material only on a component necessary in the ceramic substrate 11 via a method such as sputtering, deposition, or other suitable method.

A non-photosensitive insulating material is applied on the ceramic substrate 11 so as to cover the lower conductor pattern layer 1a via a method such as printing, or other suitable method. The insulating material is washed out by, for example, a solvent until the thickness of the insulating material becomes substantially equal to the thickness of the lower conductor pattern layer 1a so as to expose the lower conductor pattern 1a for forming the inter-line insulating layer 23. Abrasion or other suitable methods may also be used.

The non-photosensitive conductive material 12 is applied on the inter-line insulating layer 23 as a film via a method such as printing, sputtering, deposition, or other suitable method. Then, the upper conductor pattern layer 1b of the coil conductor pattern 1 is formed via a technology such as photolithography, or other suitable method. A heat treatment is conducted thereafter. Similarly, the inter-layer insulating layer 25 having a hole 5a for the via hole 5 is formed. By repeating the steps of forming lower conductor pattern layers 2a to 4a of coil conductor patterns 2 to 4, forming an inter-line insulating layer 23, forming upper conductor pattern layers 2b to 4b of coil conductor patterns 2 to 4, and forming an inter-layer insulating layer 25 at predetermined times in the same manner, the multi-layer spiral inductor 6 can be obtained.

The present invention is not limited to the above-mentioned preferred embodiments, but can be modified in various ways within the range of the gist of the present invention. For example, the conductor pattern is not limited to the four layers of the coil conductor patterns 1 to 4 as in the above-mentioned preferred embodiments, but can be formed so as to have only one layer on the insulating substrate, or so as to have two layers, three layers, or five or more layers. Moreover, the coil conductor patterns in each layer can be formed to have three or more layers. Furthermore, the shape of the conductor pattern can be a shape other than spiral, such as linear or meandering. Moreover, although the aspect ratio of the conductor pattern in the above-mentioned preferred embodiments is preferably equal to or greater than about 1, the aspect ratio can be less than 1.

Figure 13:
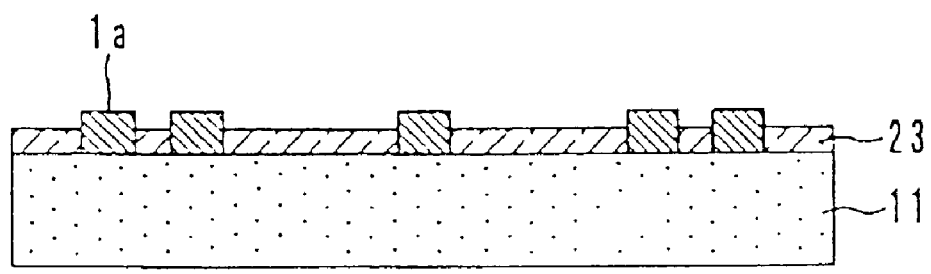
FIG. 13 is a cross-sectional view showing another preferred embodiment of the present invention.

Furthermore, as shown in FIG. 13, in forming the inter-line insulating layer 23, the insulating material 22 can be washed out until the thickness of the insulating material 22 becomes smaller than the thickness of the lower conductor pattern layers 1a to 4a so that the upper component of the lower conductor pattern layers 1a to 4a projects from the surface of the inter-line insulating layer 23.

Figure 14:
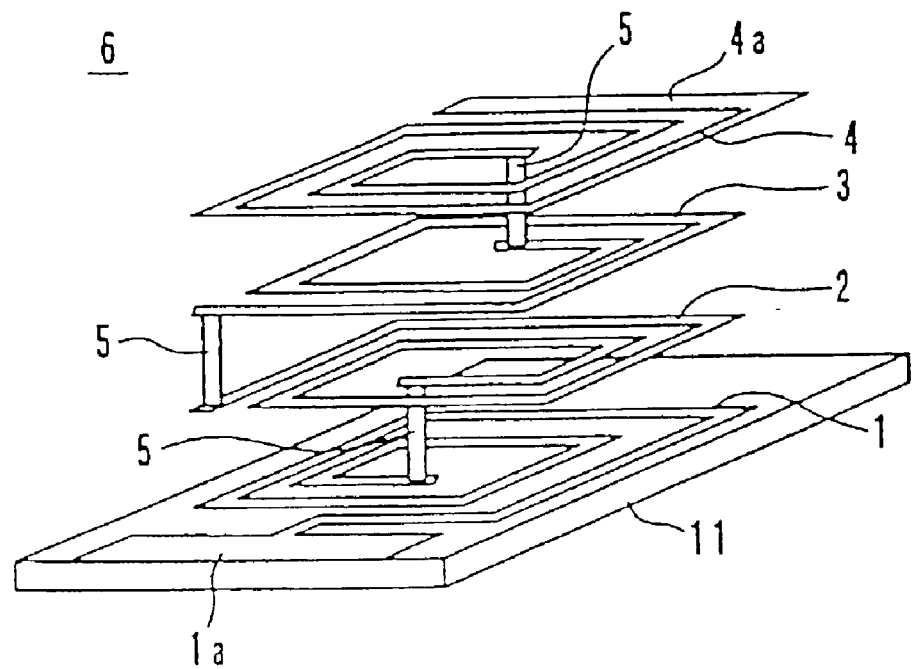
FIG. 14 is a cross-sectional view showing the configuration of another preferred embodiment of an electronic component according to the present invention.

As shown in FIG. 14, an inductor 6 includes an insulating substrate 11 and spiral coil conductor patterns 1 to 4 provided on the insulating substrate 11. The insulating substrate 11 is preferably made of a dielectric substance, a magnetic substance, or other suitable material. The coil conductor patterns 1 to 4 are connected electrically in series by via holes 5. The shape of the coil conductor patterns 1 to 4 can be a shape other than spiral, such as meandering or linear.

A method of manufacturing the multi-layer spiral inductor 6 will be explained with reference to FIGS. 15 to 25. Although the inductor 6 is produced using a mother substrate provided with a plurality of inductors in the case of mass-production, the case of individual production will be explained in the third preferred embodiment.

Figure 15:
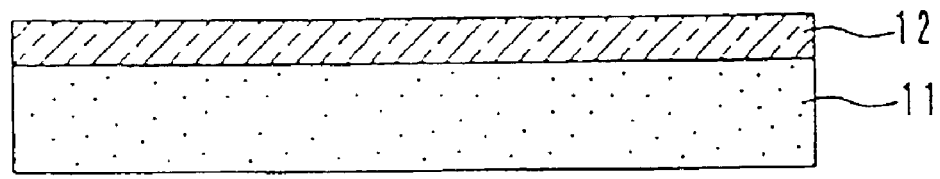
FIG. 15 is a cross-sectional view showing another preferred embodiment of a method of manufacturing an electronic component according to the present invention.
Figure 16:
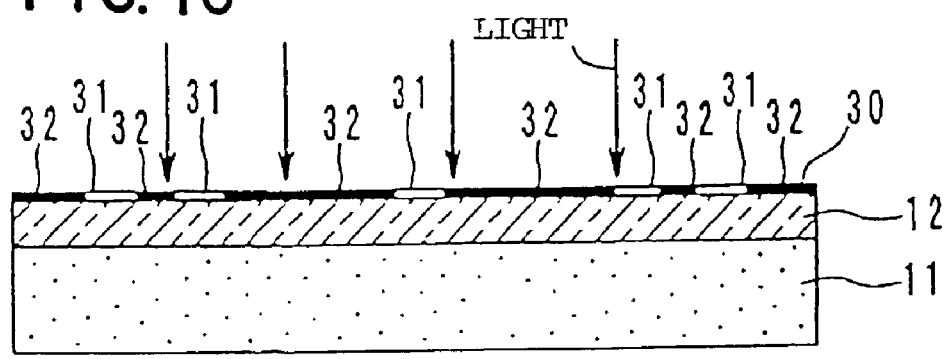
FIG. 16 is a cross-sectional view showing a manufacturing step performed subsequent to the step shown in FIG. 15.
Figure 17:
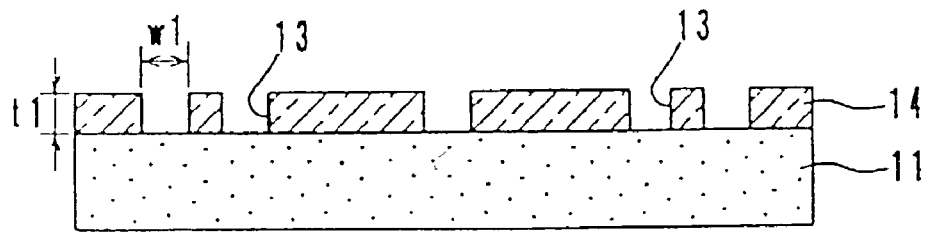
FIG. 17 is a cross-sectional view showing a manufacturing step performed subsequent to the step shown in FIG. 16.

As shown in FIG. 15, a positive type photosensitive insulating material 12 is applied on the upper surface of a ceramic substrate 11 as a film by printing a positive type photosensitive glass paste or by spin coating of a thick film positive resist. Then, as shown in FIG. 16, a negative film photo mask 30 is applied on the positive type photosensitive insulating material 12. The photo mask 30 has a light transmitting component 31 corresponding to a coil conductor pattern 1 of the first layer in FIG. 14 and a light blocking component 32. When the positive type photosensitive insulating material 12 is exposed through the photo mask 30, only the light transmitting component 31 transmits the light. By removing the photo mask 30 and developing, the exposed component of the positive type photosensitive insulating material 12 is eliminated so as to form an inter-line insulating layer 14 of the coil conductor pattern 1 having a spiral groove 13 as shown in FIG. 17. At the time, the ratio (t1/w1) of the thickness t1 of the inter-line insulating layer 14 and the groove width w1 of the spiral groove 13 is preferably set to be equal to or less than about 1.

Figure 18:
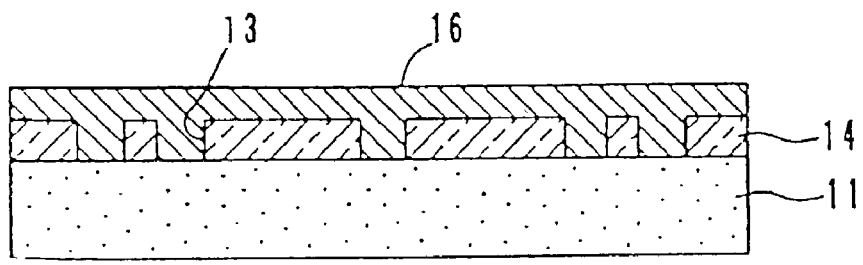
FIG. 18 is a cross-sectional view showing a manufacturing step performed subsequent to the step shown in FIG. 17.
Figure 19:
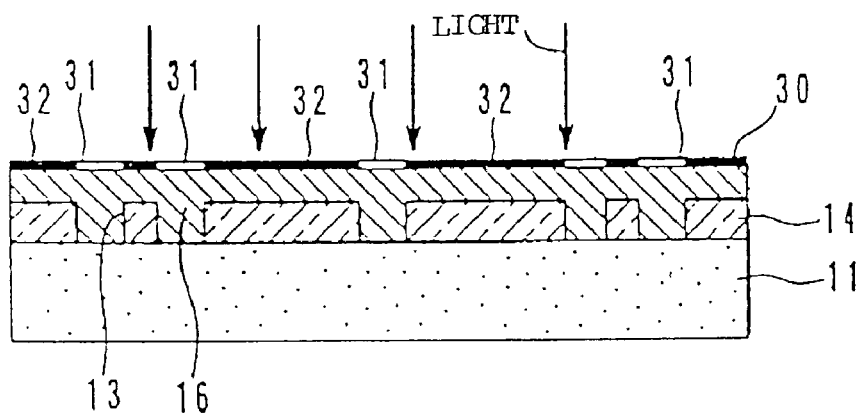
FIG. 19 is a cross-sectional view showing a manufacturing step performed subsequent to the step shown in FIG. 18.
Figure 20:
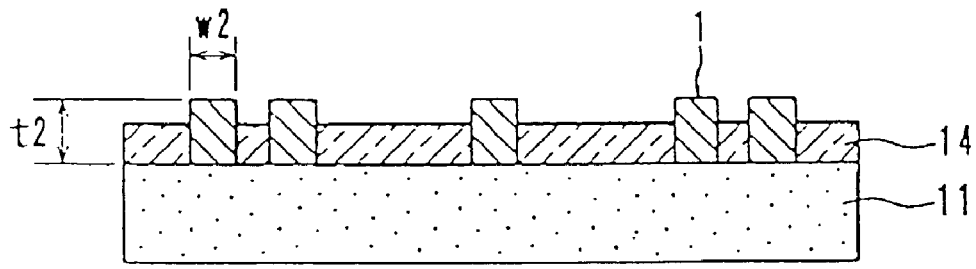
FIG. 20 is a cross-sectional view showing a manufacturing step performed subsequent to the step shown in FIG. 19.

As shown in FIG. 18, a negative type conductive material 16 is applied on the inter-line insulating layer 14 as a film by printing a negative type photosensitive silver (Ag) paste, a negative type photosensitive copper (Cu) paste, or other suitable material. At the time, the spiral groove 13 is filled with the negative type photosensitive conductive material 16 as well. Then, as shown in FIG. 19, the above-mentioned photo mask 30 is put on the negative type photosensitive conductive material 16. After exposing the negative type photosensitive conductive material 16 through the photo mask 30, the negative type photosensitive conductive material is developed as shown in FIG. 20 so as to eliminate the unexposed component of the negative type photosensitive material 16. Accordingly, a first layer coil conductor pattern 1 (see FIG. 14) is formed on the ceramic substrate 11. The coil conductor pattern 1 is formed such that the aspect ratio (t2/w2), which is the ratio of the thickness t1 thereof and the pattern width w2, is equal to or greater than about 1. Thereafter, a heat treatment is conducted.

Figure 21:
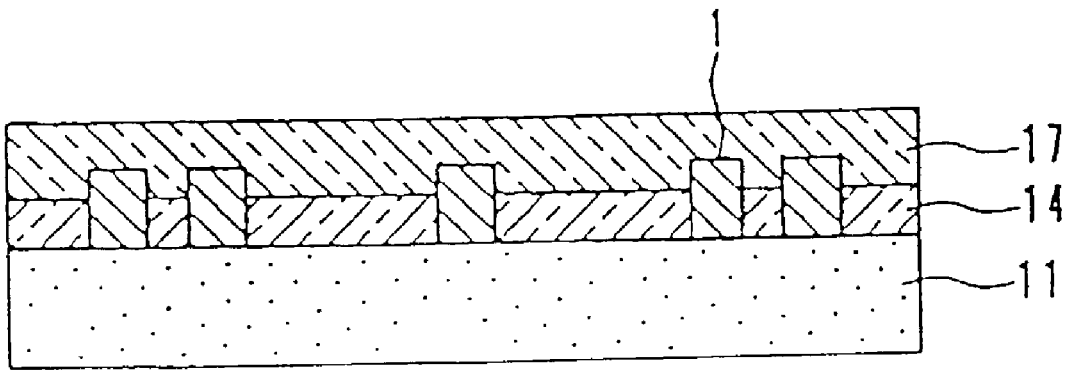
FIG. 21 is a cross-sectional view showing a manufacturing step performed subsequent to the step shown in FIG. 20.
Figure 22:
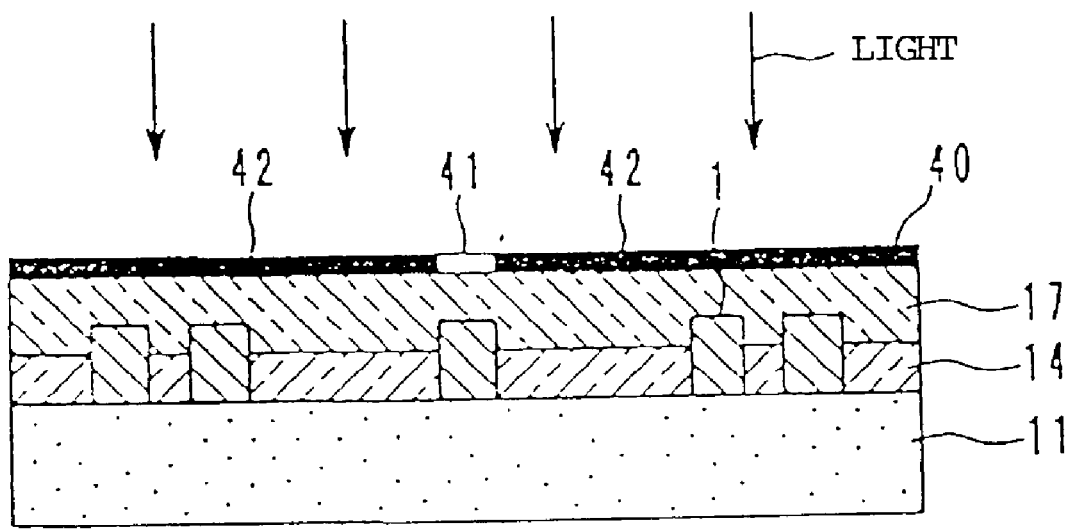
FIG. 22 is a cross-sectional view showing a manufacturing step performed subsequent to the step shown in FIG. 21.
Figure 23:
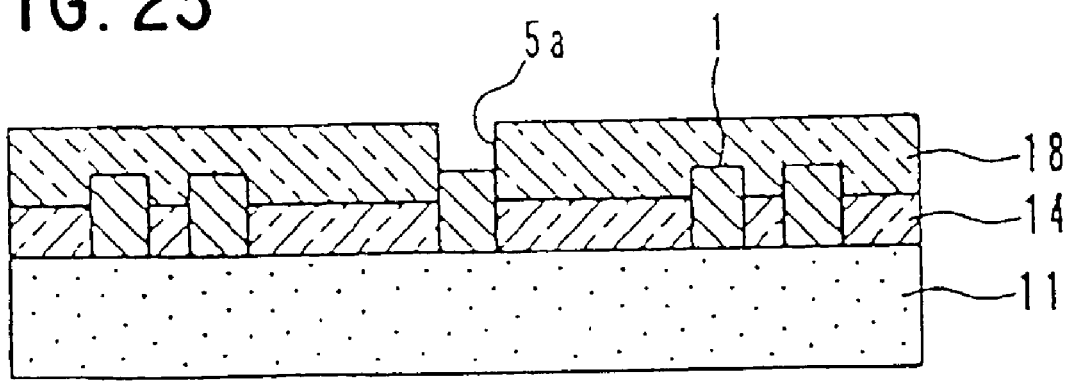
FIG. 23 is a cross-sectional view showing a manufacturing step performed subsequent to the step shown in FIG. 22.

As shown in FIG. 21, a positive type photosensitive insulating material 17 is applied on the inter-line insulating layer 14 and the coil conductor pattern 1 as a film by printing a positive type photosensitive glass paste, or other suitable material. Then, a photo mask 40 is put on the positive type photosensitive insulating material 17 as shown in FIG. 22. The photo mask 40 has a light transmitting component 41 corresponding with a via hole 5 for being electrically connected to the first layer coil conductor pattern 1 shown in FIG. 14 and a light blocking component 42. By exposing the positive type photosensitive insulating material 17 through the photo mask 40, only the light transmitting component 41 transmits the light. Then, by removing the photo mask 40 and developing, the exposed component of the positive type photosensitive insulating material 17 is eliminated so as to form an inter-layer insulating layer 18 having a hole 5a for the via hole 5 as shown in FIG. 23. Then, a heat treatment is conducted again.

Figure 24:
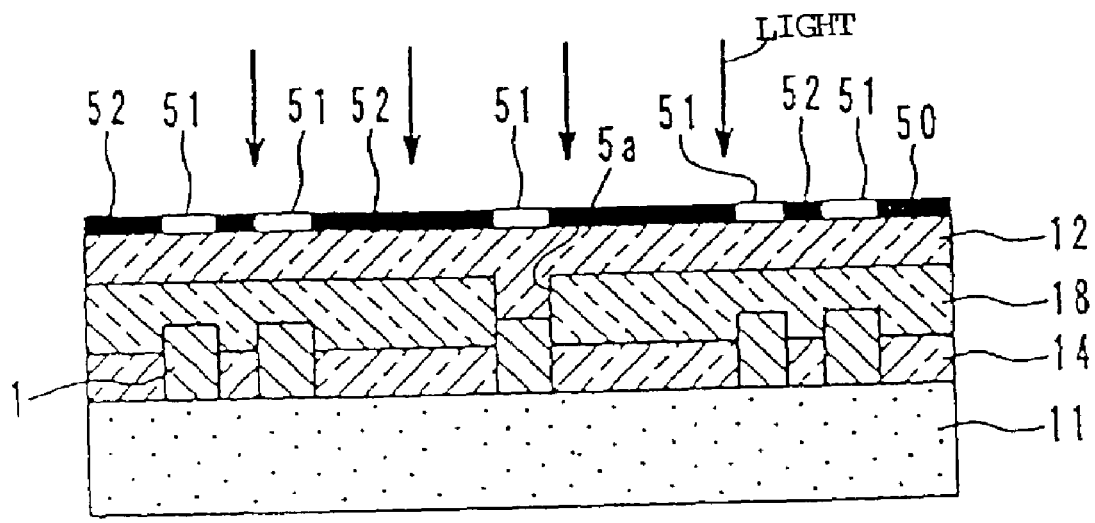
FIG. 24 is a cross-sectional view showing a manufacturing step performed subsequent to the step shown in FIG. 23.
Figure 25:
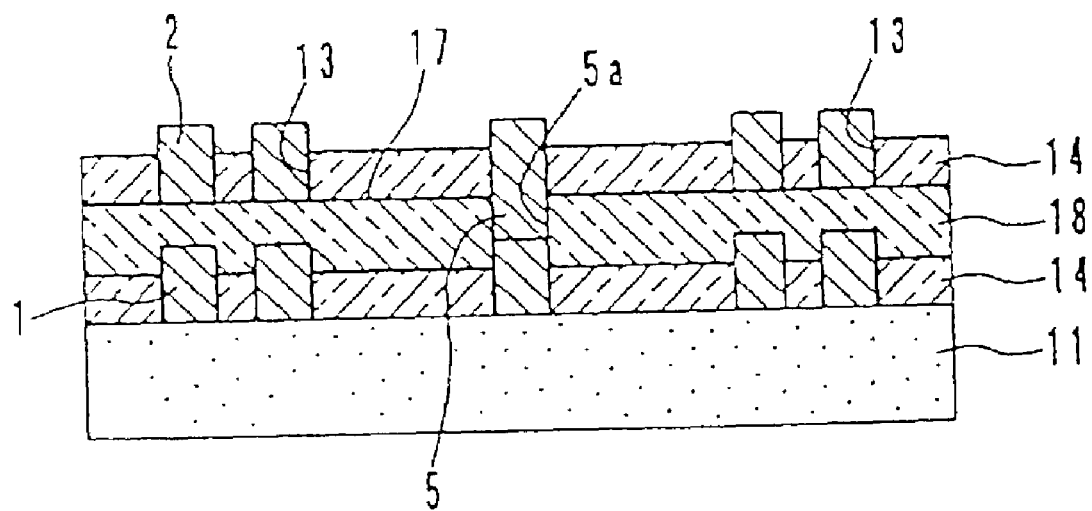
FIG. 25 is a cross-sectional view showing a manufacturing step performed subsequent to the step shown in FIG. 24.

As shown in FIG. 24, the positive type photosensitive insulating material 12 is applied on the inter-layer insulating layer 18 as a film via a method such as printing a positive type photosensitive glass paste, or other suitable material. Then, a photo mask 50 is put on the positive type photosensitive insulating material. 12. The photo mask 50 has a light transmitting component 51 corresponding with a coil conductor pattern 2 in the second layer of FIG. 14 and a light blocking component 52. After exposing the positive type photosensitive insulating material 12 through the photo mask 50, it is developed so as to eliminate the exposed component of the positive type photo sensitive insulating material 12 so as to form an inter-layer insulating layer 14 having a spiral groove 13.

Furthermore, the negative type photosensitive conductive material 16 is applied on the inter-line insulating layer 14 as a film. At the time, the spiral groove 13 and the hole for via hole 5a are filled with the negative type photosensitive conductive material 16. Then, the above-mentioned photo mask 50 is put on the negative type photosensitive conductive material 16. After exposing the negative type photosensitive conductive material 16 through the photo mask 50, the negative type photosensitive film is developed for eliminating the unexposed component of the negative type photosensitive conductive material 16. Accordingly, a second layer coil conductor pattern 2 (see FIG. 14) is formed on the inter-line insulating layer 14. The coil conductor pattern 2 is connected electrically with the coil conductor pattern 1 through the via hole 5.

After repeating the steps of forming an inter-line insulating layer 14, forming coil conductor patterns 3, 4, and forming an inter-layer insulating layer 18 at predetermined times in the same manner, an exterior protection film is formed. If the above-described layers are formed on a mother substrate state, furthermore, the mother substrate needs to be cut out according to a predetermined product size via a suitable cutting method such as scribing, breaking or dicing. Terminal electrodes to be connected with the connecting component 1a of the first layer coil conductor pattern 1 and the connecting component 4a of the fourth layer coil conductor pattern 4 of FIG. 14 are formed on both end components of the ceramic substrate 11. Accordingly, a multi-layer spiral inductor 6 having a configuration where the spiral conductor patterns 1 to 4 are connected electrically through the via holes 5 between a pair of the terminal electrodes can be obtained.

According to a third preferred embodiment, since each of the coil conductor patterns 1 to 4 is formed in the spiral groove 13 of the inter-line insulating layer 14 in a state where the upper component thereof projects from the inter-line insulating layer 14, the coil conductor patterns 1 to 4 can have a height or vertical dimension that is greater than the resolution limit in the depth direction of the negative type photosensitive conductive material 16 defining the same so that a multi-layer spiral inductor having a high aspect ratio of about 1 or more can be obtained. Accordingly, the direct current resistance value of the coil conductor patterns 1 to 4 can be small so as to prevent any decrease in the Q value. Moreover, even if the width of the coil conductor patterns 1 to 4 is made narrower for minimizing the size of the multi-layer spiral conductor 6, the increase of the conductor loss of the coil conductor patterns 1 to 4 can be prevented and deterioration of the Q value accompanying the reduction in size can be prevented as well. Furthermore, by setting the ratio of the thickness t1 of the inter-line insulating layer 14 and the groove width w1 of the spiral groove 13 preferably to be about 1 or less, the dimensional accuracy of the coil conductor patterns 1 to 4 is greatly improved and the deviation of the inductance value is minimized.

In the fourth preferred embodiment, the case of producing an inductor with a negative type photosensitive insulating material used as the material of the inter-line insulating layer 14 and the inter-layer insulating layer 18, a positive type photosensitive conductive material used as the material of the coil conductor patterns 1 to 4, and a positive film used for the photo mask will be explained.

A negative type photosensitive insulating material is applied on the ceramic substrate 11 as a film. Then, after exposing the negative type photosensitive insulating material through a photo mask (positive film) having a light blocking component corresponding with a coil conductor pattern 1, the negative type photosensitive insulating material is developed for eliminating the unexposed component of the negative type photosensitive insulating material so as to form an inter-line insulating layer 14 having a spiral groove 13 of the coil conductor pattern 1.

A positive type photosensitive conductive material is applied on the inter-line insulating layer 14 as a film such that the spiral groove 13 is also filled. Then, after exposing the positive type photosensitive conductive material through the above-mentioned photo mask (positive film), the positive type photosensitive insulating material t is developed for eliminating the exposed component of the positive type photosensitive conductive material so as to form a coil conductor pattern 1 at the position of the spiral groove 13. Similarly, an inter-line insulating layer 18 is formed. By repeating the steps of forming an inter-line insulating layer 14, forming coil conductor patterns 2 to 4, and forming an inter-layer insulating layer 18 at predetermined times in the same manner, the multi-layer spiral inductor 6 can be obtained.

The present invention is not limited to the above-mentioned preferred embodiments, but can be modified in various ways within the range of the gist of the present invention.

For example, as the material of the inter-line insulating layer 14 and the inter-layer insulating layer 18 other than a photosensitive insulating material, a non-photosensitive insulating paste can be used. In this case, after forming the insulating paste as a film via a method such as printing, or other suitable method, the inter-line insulating layer 14 and the inter-layer insulating layer 18 are formed by a known photolithography technology (resist film application, exposure, resist film development, insulating paste etching, resist film peeling), or other suitable method. Moreover, as the material of the coil conductor patterns 1 to 4 other than the photosensitive conductive material, a non-photosensitive conductive material can be used. In this case, after forming the conductive material as a film by a method such as printing, sputtering, deposition or other suitable method, the coil conductor patterns 1 to 4 are formed by photolithography technology, or other suitable method.

Moreover, the number of the layers of the coil conductor pattern is not limited to four layers, but can be one layer, two layers, three layers, or five or more layers. Moreover, the aspect ratio, which is the ratio of the thickness t2 to the width w2 of the coil conductor pattern, is not necessarily equal to or greater than about 1, but can be less than about 1.

As apparent from the explanation above, according to the present invention, since the conductor pattern includes the lower conductor pattern layer and the upper conductor pattern layer laminated thereon and the aspect ratio is approximately 1 or more, the direct current resistance value of the conductor pattern is very small. Therefore, by having a coil conductor pattern as the conductor pattern, an inductor with a high Q value is obtained. Moreover, even if the width of the conductor pattern is made narrower for achieving a small component size, the increase of the conductor loss of the conductor pattern is minimized and the decline of the Q value accompanying the downsizing is also prevented.

Moreover, according to the present invention, even if a film thickness which is greater than the resolution limit of the conductive material in the depth direction cannot be obtained by an independent formation step of each lower conductor pattern layer and upper conductor pattern layer of the conductor pattern, by forming the upper conductor pattern layer on the lower conductor pattern layer, an electronic component having a conductor pattern with a high aspect ratio can be obtained easily.

Furthermore, according to the present invention, since each of the conductor patterns are formed in the pattern groove of the inter-line insulating layer in a state where the upper component thereof projects from the inter-line insulating layer, the conductor pattern has a height or vertical dimension that is greater than the resolution limit of the conductive material in the depth direction so that a conductor pattern having a high aspect ratio is obtained and the direct current resistance value of the conductor pattern is very small. Furthermore, by setting the ratio of the film thickness of the interline insulating layer and the groove width of the pattern groove to less than or equal to about 1, an electronic component almost no dimensional irregularity of the conductor pattern is obtained.

Moreover, since the conductor pattern is a coil conductor pattern, even if the inductance value is enlarged by increasing the number of turns of the coil conductor pattern, the increase of the conductor loss of the coil conductor pattern is prevented and the decline of the Q value is prevented. Furthermore, even if the coil conductor pattern width is made narrower for minimizing the size of the inductor, the increase of the conductor loss of the coil conductor is prevented and the decline of the Q value accompanying the reduction in size is prevented as well.

While the invention has been particularly shown and described with reference to preferred embodiments thereof, it will be understood by those skilled in the art that the forgoing and other changes in form and details may be made therein without departing from the spirit of the invention.

What is claimed is:

1. A method of manufacturing an electronic component comprising the steps of:
    applying a positive type photosensitive insulating material on an insulating substrate;
    exposing the positive type photosensitive insulating material through a photo mask having a light transmitting component corresponding with a conductor pattern;
    eliminating the exposed component of the positive type photosensitive insulating material so as to form an inter-line insulating layer having a pattern groove;
    applying a negative type photosensitive conductive material on the inter-line insulating layer;
    exposing the negative type photosensitive conductive material through the photo mask; and
    eliminating the unexposed component of the negative type photosensitive conductive material so as to form a conductor pattern at the position of the pattern groove.

2. The method according to claim 1, wherein a ratio of a thickness of the inter-line insulating layer and a width of the pattern groove is equal to or less than about 1.

3. The method according to claim 1, wherein a ratio of a thickness of the conductor pattern and a width of the conductor pattern is equal to or greater than about 1.

4. The method according to claim 1, wherein the inter-line insulating layer is formed so as to have via holes therein.

5. The method according to claim 1, wherein the conductor pattern is a coil conductor pattern.

6. The method according to claim 1, wherein the conductor pattern has a spiral shape.

7. A method of manufacturing an electronic component comprising the steps of:
    applying a negative type photosensitive insulating material on an insulating substrate;
    exposing the negative type photosensitive insulating material through a photo mask having a light blocking component corresponding with a conductor pattern;

eliminating the unexposed component of the negative type photosensitive insulating material so as to form an inter-line insulating layer having a pattern groove;

applying a positive type photosensitive conductive material on the inter-line insulating;

exposing the positive type photosensitive conductive material through the photo mask; and eliminating the exposed component of the positive type photosensitive conductive material so as to form a conductor pattern at the position of the pattern groove.

8. The method according to claim 7, wherein a ratio of a thickness of the inter-line insulating layer and a width of the pattern groove is equal to or less than about 1.

9. The method according to claim 7, wherein a ratio of a thickness of the conductor pattern and a width of the conductor pattern is equal to or greater than about 1.

10. The method according to claim 7, wherein the inter-line insulating layer is formed so as to have via holes therein.

11. The method according to claim 7, wherein the conductor pattern is a coil conductor pattern.

12. The method according to claim 7, wherein the conductor pattern has a spiral shape.

* * * * *